US008059129B2

(12) United States Patent
Sullivan et al.

(10) Patent No.: US 8,059,129 B2
(45) Date of Patent: Nov. 15, 2011

(54) FAST RASTERIZER

(75) Inventors: Steven K. Sullivan, Beaverton, OR (US); Terrance R. Beale, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 942 days.

(21) Appl. No.: 11/393,129

(22) Filed: Mar. 29, 2006

(65) Prior Publication Data

US 2007/0236480 A1    Oct. 11, 2007

(51) Int. Cl.
*G06T 1/60* (2006.01)

(52) U.S. Cl. ............................................ 345/530; 711/1

(58) Field of Classification Search .................. 345/204, 345/467, 440.1, 694, 501–506, 530–574; 711/1–6, 154–158; 712/1–43
See application file for complete search history.

(56) References Cited

U.S. PATENT DOCUMENTS

| 3,345,458 | A | * | 10/1967 | Cole et al. ...................... 345/467 |
| 3,786,476 | A | | 1/1974 | Graves |
| 4,093,995 | A | * | 6/1978 | Smith et al. ...................... 345/24 |
| 4,134,149 | A | | 1/1979 | Nord |
| 4,785,415 | A | * | 11/1988 | Karlquist ...................... 713/401 |
| 5,254,983 | A | | 10/1993 | Long |
| 5,255,365 | A | | 10/1993 | Hungerbuhler |
| 5,434,593 | A | | 7/1995 | Lecklider |
| 5,530,454 | A | | 6/1996 | Etheridge |
| 5,781,200 | A | * | 7/1998 | Lu et al. ........................ 345/568 |
| 6,104,374 | A | | 8/2000 | Sullivan |
| 6,278,435 | B1 | | 8/2001 | Etheridge |
| 6,567,092 | B1 | * | 5/2003 | Bowen ........................... 345/506 |
| 6,912,638 | B2 | * | 6/2005 | Hellman et al. ............... 711/167 |
| 2004/0012600 | A1 | * | 1/2004 | Deering et al. ............... 345/506 |
| 2004/0227748 | A1 | * | 11/2004 | Iwata et al. ...................... 345/204 |
| 2005/0022065 | A1 | * | 1/2005 | Dixon et al. ...................... 714/42 |

FOREIGN PATENT DOCUMENTS

| EP | 0420281 A | 4/1991 |
| EP | 0738089 A | 10/1996 |

OTHER PUBLICATIONS

Holcomb M.S., et al.: "A High-Throughput Acquisition Architecture for a 100-MHZ Digitizing Oscilloscope", Hewlett-Packard Journal, Hewlett-Packard Company, Palo Alto, California. vol. 43, No. 1, Feb. 1, 1992, pp. 11-20, XP000349368, p. 13, paragraph 1—p. 17.

* cited by examiner

*Primary Examiner* — Amr Awad
*Assistant Examiner* — Liliana Cerullo
(74) *Attorney, Agent, or Firm* — Francis I. Gray; Thomas F. Lenihan

(57) ABSTRACT

A fast rasterizer uses a fast memory that has a bit-set port for receiving data and a totally independent readout and clear port for outputting a waveform image. The fast memory is organized into rows and columns corresponding to the rows and columns of a raster display device, with each memory location or cell holding a single bit. The fast memory is divided into parallel sections so that one column of each section may be written into each clock cycle, resulting in the possibility of writing a plurality of columns into the fast memory each clock cycle. Each memory cell is set when a row and column write signal for the cell are asserted, and is read out and cleared when a row and column read signal for the cell are asserted. Row logic using thermometer codes is used to set the row lines for the selected column in each section.

2 Claims, 4 Drawing Sheets

1

FAST RASTERIZER

BACKGROUND OF THE INVENTION

The present invention relates to converting digitized data into a waveform image for display on a raster scan device, and more particularly to a fast rasterizer that allows data to be displayed at rates similar to the fastest data acquisition rates.

Waveform imaging hardware has been getting progressively faster, and this trend certainly is continuing. An early scheme for waveform imaging produced an image of a single waveform during each frame of a raster scan display. The digitized data is held in a memory and repeatedly read out once for each line in the frame. At each pixel time the digitized data for that column is compared to the line number and the comparison is used to determine if a dot is to be displayed. U.S. Pat. No. 3,786,476 entitled "Television Type Display System for Displaying Waveforms of Time-Varying Signals" describes such a system in which up to four waveforms may be displayed and scrolled. A number of variations on this scheme are used to fill in missing vertical lines and to scale the waveform. In all of these schemes the waveform update rate is limited to about one waveform per frame or about sixty per second.

When memory became less expensive a memory was used to hold a raster image of the waveform. The memory is read out once for each frame and the contents of the memory are used to set the greyscale and to specify the color of the pixels. Initially a microprocessor built the waveform images. This scheme appears to be mentioned in U.S. Pat. No. 4,134,149 entitled "High Sweep Rate Waveform Display Control for Digital Recording Waveform Devices." Later, custom hardware was designed both to place the waveform image into the memory and to cause the waveform images to fade with time. U.S. Pat. No. 5,254,983 entitled "Digitally Synthesized Gray Scale for Raster Scan Oscilloscope Displays" describes one variation of this technique.

In order to increase the rate of drawing waveform images some instruments included many sets of the hardware. In some cases each set was used for a different channel, as in U.S. Pat. No. 5,530,454 entitled "Digital Oscilloscope Architecture for Signal Monitoring with Enhanced Duty Cycle." In other cases multiple sets of this hardware were used with a single channel. Waveform update rates of around 400,000 per second are claimed.

The length of the digitized data in number of samples often greatly exceeds the width of the display in pixel columns. In order to decrease the waveform drawing time, hardware was designed that divided the digitized data into groups and then found the maximum and minimum values within each group. These values are then used to draw the waveform image. This is shown in U.S. Pat. No. 5,255,365 entitled "Method and Apparatus for Compacting Digital Time Series Data for Display on a Digital Oscilloscope." Although the display may not look as nice as if all of the data were used, this technique greatly reduces the drawing time when the record length, i.e., number of acquired samples, is long. Another technique for decreasing the waveform drawing time is to discard portions of the data. This is described in U.S. Pat. No. 6,104,374 entitled "Sparse Vector Rasterization." When lots of waveforms are being drawn, users may not notice that portions of the waveforms have not been drawn in as much detail as when few waveforms are being drawn.

A technique to reduce waveform drawing time while preserving all of the data is to have a special purpose, one-column memory that keeps track of the intensity of every pixel in just one column of the display image. The display image is drawn from left to right, one column at a time. Prior to processing a column, the special purpose memory is cleared. The digitized data for that column is then processed one sample at a time. Lines are drawn between samples by incrementing memory elements corresponding to the pixels in the column. The increment amount may be varied based on the length of each line to allow long lines to appear fainter. After processing the data for the column, the memory contents are transferred to a holding memory. At this point the process of forming the image for the next column starts. While the next column image is being formed, the holding memory is combined with a traditional raster memory to merge the image of the last column into the previously drawn waveform images. This is described in U.S. Pat. No. 6,278,435 entitled "Compression and Acquisition Count Optimization in a Digital Oscilloscope Variable Intensity Rasterizer." A limiting factor of this technique is the time it takes to merge the new image with the prior images. To reduce the amount of merging, this technique is used to produce an image of many waveforms in parallel. An image of the first column of many waveforms is developed in the special purpose memory. This first column image is merged into the traditional raster memory while the second column is being generated.

Regardless of which of the above techniques is used to make waveform images faster, digital oscilloscopes still acquire data many times faster than the data can be displayed. For example a TDS1000 digital oscilloscope, manufactured by Tektronix, Inc. of Beaverton, Oreg., has a waveform display where the fastest horizontal axis is 2.5 ns per division and each division has twenty-five pixel columns. A waveform drawing machine that keeps up with the acquisition of data must draw ten pixel columns of the waveform image each nanosecond. In order to draw one nanosecond of the waveform image, at least ten pixels must be set in the waveform memory. Even more pixels must be set when the waveform is rapidly rising or falling. It is challenging to draw ten pixel columns of a picture in one nanosecond since most memory devices have an access time of more than one nanosecond and no memories allow ten independent locations to be accessed in a single cycle.

What is desired is a faster rasterizer that makes it possible to display data at rates similar to the fastest data acquisition rates.

BRIEF SUMMARY OF THE INVENTION

Accordingly the present invention provides a fast rasterizer that has a fast memory with a bit-set port for receiving data and a totally independent readout and clear port for outputting a waveform image. The fast memory is organized into rows and columns corresponding to the rows and columns of a raster display device, with each memory location or cell holding a single bit. The fast memory is divided into parallel sections so that one column of each section may be written each clock cycle, resulting in the possibility of writing a plurality of columns into the fast memory each clock cycle. Each memory cell is set when a row and column write signal for the cell are asserted, and is read out and cleared when a row and column read signal for the cell are asserted. Row logic using thermometer codes is used to set the row lines for the selected column in each section.

The objects, advantages and other novel features of the present invention are apparent from the following detailed description when read in conjunction with the appended claims and attached drawing.

DETAILED DESCRIPTION OF THE INVENTION

Figure 1:
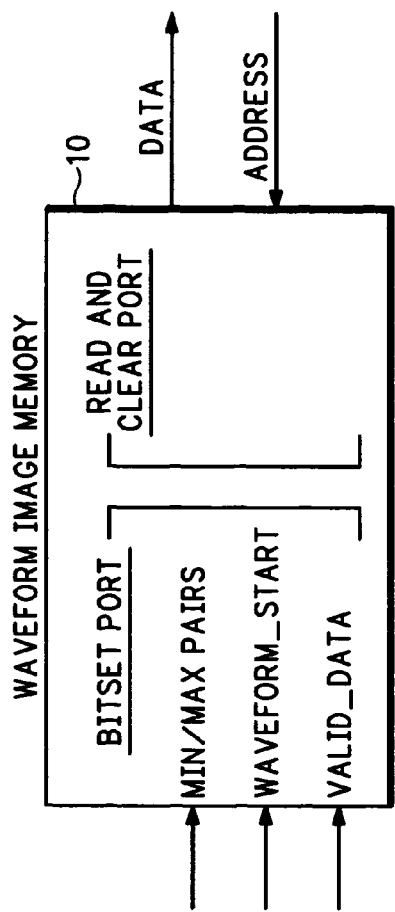
FIG. 1 is a block diagram of a fast memory for use in the fast rasterizer according to the present invention.
Figure 2:
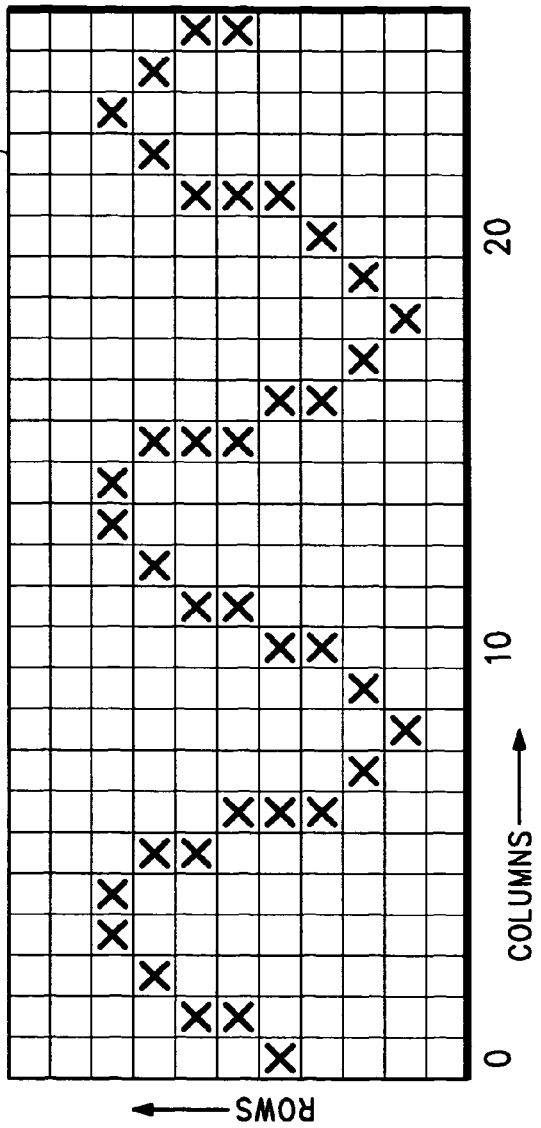
FIG. 2 is a representative view of a layout for the fast memory according to the present invention.
Figure 3:
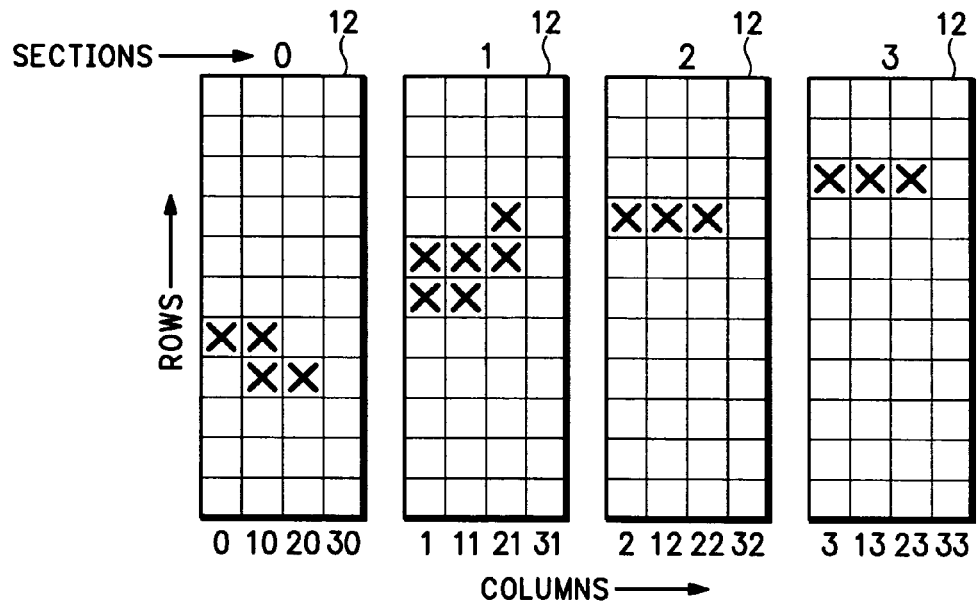
FIG. 3 is a representative view of sections of the fast memory according to the present invention.
Figure 4:
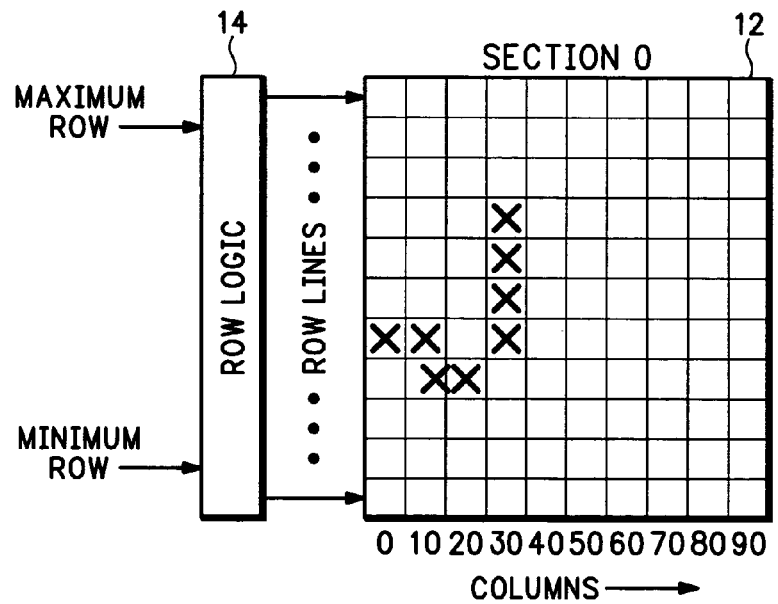
FIG. 4 is a block diagram view of row logic for one section of the fast memory according to the present invention.

The heart of the present invention is a custom memory 10 designed specifically for rapidly making waveform images. An implementation of this custom memory may be built using Complementary Metal-Oxide Semiconductor (CMOS) technology. The custom memory 10 is built to keep up with the drawing rate of modern digital oscilloscopes, even when the waveform is rapidly rising or falling. The main features of the custom memory 10 are:

the memory is a dual port memory, as shown in FIG. 1—one of the two ports is only used for placing the waveform images into the memory and only sets bits in the memory and the other port is used to read the image and to clear the memory.

the memory is organized into rows and columns corresponding to the rows and columns on a raster display device, as shown in FIG. 2—each memory location or cell 12 corresponds to a pixel and holds a single bit so that the waveform is indicated by the bits set, i.e., gray scale and color are added when the contents of the memory are read and combined with data held in a traditional raster memory.

the memory is divided into sections that operate in parallel, as shown in FIG. 3—each section has some of the columns of the full memory, i.e., for ten sections the first section has columns 0, 10, 20, 30, etc., the second section has columns 1, 11, 21, 31, etc., so that ten sets of data are delivered to the memory on each system clock and bits are set in ten columns at a time. A different number of columns may be chosen in different implementations, with more sections resulting in faster operation at the expense of more circuitry.

each section of the memory draws one vertical column of the waveform each memory cycle—row logic 14 is used with conventional circuitry determining a starting and ending row number (or minimum and maximum row number) to be drawn, as shown in FIG. 4. The row logic 14 takes these values and sets all of the row lines from the start to the end value, and memory cells that receive a high signal on both a row line and column line are set to a high state so that a complete vertical line segment, regardless of length, is drawn at one time. As shown in FIG. 4 four memory cells are set in column 30 in one operation when the start row value is four and the end row value is seven, while at the same time adjacent portions of the waveform image are drawn in other sections of the memory 10.

By combining these four features into the custom memory 10, it is possible to draw many columns of a waveform image in one memory cycle. For a TDS2000-type digital oscilloscope, manufactured by Tektronix, Inc. of Beaverton, Oreg., the fastest time axis is 2.5 ns per division with 25 pixel columns per division. To draw a waveform image at the same rate as it is being acquired, the memory 10 may be divided into twenty sections and operate with a 2 ns clock cycle time.

Although the fast custom memory 10 does not accommodate gray scale, the waveform image presented to the user on the display device may contain color and gray scale information. The waveform image is read out of the fast custom memory 10 on a periodic basis. Reading is asynchronous to setting bits and does not interfere with the generation of the waveform images. When the fast custom memory 10 is read out, it is combined with gray scale and color information held in the conventional waveform image memory. When new waveforms to be drawn arrive slowly because of the trigger rate, they may be extracted from the fast memory 10 one at a time and the gray scale information is similar to that in conventional rasterizer circuits. When waveforms arrive at a very fast rate, groups of waveforms are ORed together in the fast memory 10 before they are transferred to the gray scale memory.

In order to draw the waveform images of different input channels in different colors, each channel of the instrument needs a fast custom memory 10. Even greater waveform drawing speed is achieved when each channel uses two or more fast memories 10 operating in parallel.

The process of reading the fast memory 10 also clears the memory. Occasionally the same memory cell 12 may be set and cleared at the same time, which may result in the bit set operation being lost and a point on the waveform being missed. The memory 10 may be read slowly, at a rate that is similar to the update rate of the display device. Also the memory 10 may be read in a pseudo-random sequence to make it difficult to observe a beat between the read sequence and either the drawing sequence or the update of the display device.

Figure 5:
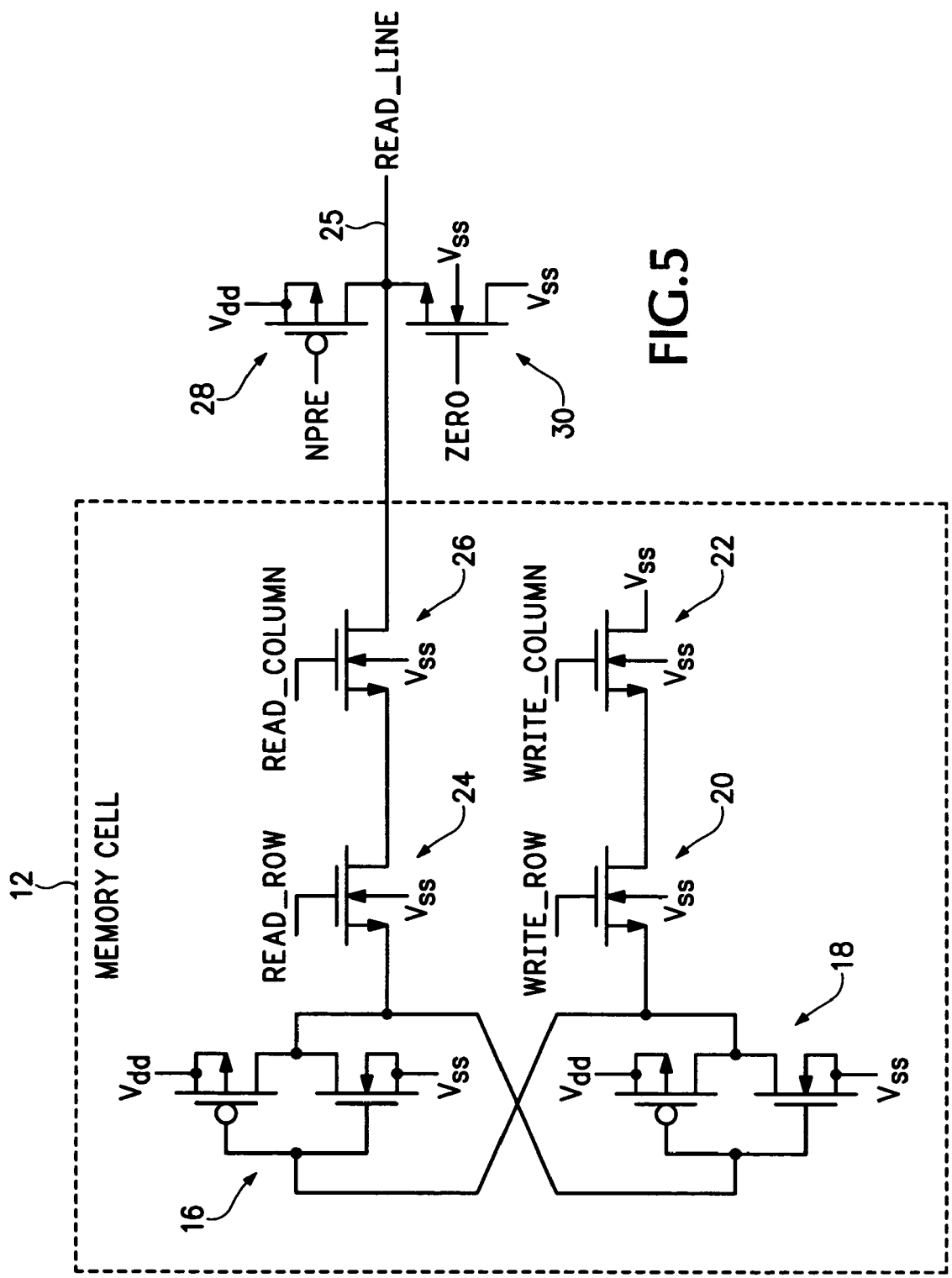
FIG. 5 is a schematic diagram view of a memory cell for the fast memory according to the present invention.

FIG. 5 shows a memory cell 12 for the fast custom memory 10. The memory cell 12 has two inverters 16, 18 connected back-to-back. The inverters 16, 18 are built with strong n-channel and weak p-channel transistors in this embodiment. The output of the lower inverter 18 is forced low when both the write-row and write-column signals are asserted to turn on respective transistors 20, 22, which are stronger than the inverter pull-up transistor. This sets the output of the top inverter 16 "high", causing the memory cell 12 to be set.

The content of the memory cell 12 is read out by pre-charging a read-line 25 to a logic "high" level via a pre-charge transistor 28 by taking the normally high npre signal briefly low. After being pre-charged, the read_line 25 is connected to the memory cell 12 when both the read_row and read_column transistors 24, 26 are turned on. If the memory cell 12 is in the "low" state, it takes the read-line 25 "low." Otherwise the read_line 25 remains "high." After reading the state of the memory cell 12, the memory cell is cleared by asserting the zero signal to a clear transistor 30 while the read_row and read_column signals remain asserted. This pulls the output of the top inverter 16 "low", causing the memory cell 12 to go to the "low" state.

The row logic 14 may operate in different modes. In a vector mode the logic for each section of the fast memory 10 is given a start and an end row number. The row logic 14 then sets all of the row lines starting with the start row and ending with the end row. In a peak detect mode the row logic 14 is given a minimum and a maximum row number, and the row logic sets all of the row lines starting with the minimum row number and going to the maximum row number. In a dot mode the row logic 14 is given a single row number and a single row line is set. One variation is a vector mode that either leaves out the start or end row to keep the adjacent end points of each vertical line from being drawn in adjacent columns.

The basic scheme for quickly setting the row lines uses logic that converts a binary number into a thermometer code. The start and end, or minimum and maximum, values are each converted into a thermometer code. The thermometer code gets its name from the behavior of a mercury thermometer. The output of the thermometer code is N logic signals, where N is the number of rows in the memory. The logic outputs are numbered from 0 to N−1. The logic outputs with a number less than the input value are "high" and the logic outputs with a number greater than or equal to the input value are "low." Both row values are converted into thermometer codes and XOR-type gates are placed between the two thermometer code outputs to respond to the one output being "high" and the other output being "low." The XOR gates produce an output that is then used to drive the row lines of one section of the memory 10. There are many types of logic that may be placed between the thermometer codes to drive the row lines.

Figure 6:
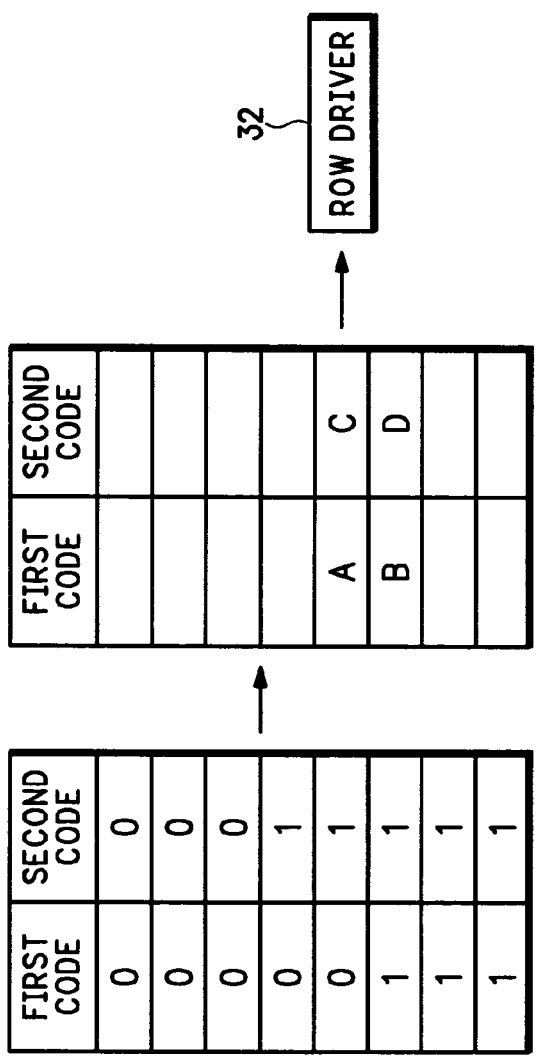
FIG. 6 is a representative view illustrating how a row drive is activated for the fast memory according to the present invention.

In one type of logic to generate the row drive each row driver 32 receives four inputs, two from the first thermometer code and two from the second thermometer code, as shown in FIG. 6. If the two inputs from the first thermometer code are A and B, with A being more significant, then the dot-mode logic for the row driver 32 is ~A& B causing the row driver output to be high when A is zero and B is one. The two inputs from the second thermometer code may be labeled C and D, with C being the more significant. In FIG. 6 two thermometer codes are shown for inputs of 3 and 5. The locations of the A, B, C and D terms for the row driver 32 are shown to the right. The term ~A&B is true when the first code matches this row, as shown in this example. The term ~C&D is true when the second code matches this row. The term ~A&C is true when a vector starts at or below this row and goes above this row. The term B&~D is true when a vector starts at or above this row and goes below this row. By combining the three terms with an OR function, (~A&B)|(~A&C)|(B&~D), the function is true when a rising vector passes this row or a falling vector passes this row or when a vector starts in this row. This is used when plotting vectors. When plotting min/max pairs, the OR of all four terms is used.

Many combinations of A, B, C and D are illegal when using thermometer codes as inputs. Other combinations are illegal when plotting min/max pairs assuming that the minimum is the first input. Using these "don't care" conditions to reduce the number of gates, the following equation draws both vectors, omitting the final point, and min/max pairs:

row_drive=~((*A*&*D*)|(~*B*&~*D*)|(*X*&~*B*&~*C*)); for min/max *X*=0 and for vectors *X*=1

At the start of each cycle of operation the fast memory 10 loads the two row values (min and max or start and end) for each section into registers. The logic described above then asserts the row lines corresponding to the rows in which pixels are to be set.

Figure 7:
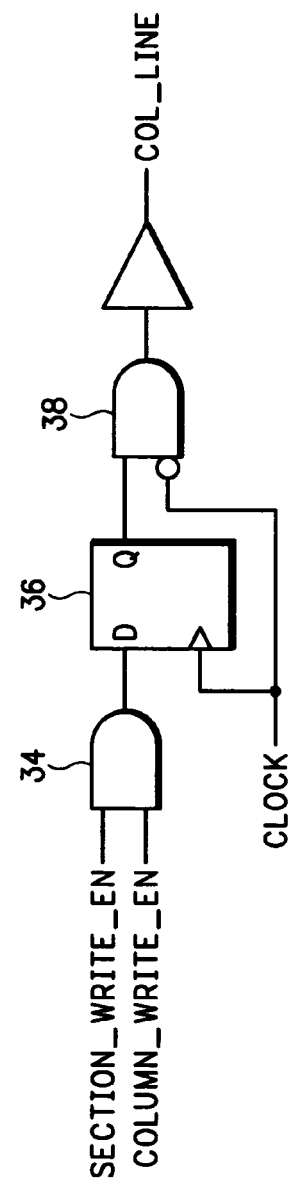
FIG. 7 is a block diagram view of a column logic for the fast memory according to the present invention.

As described above, the fast memory 10 is divided into sections and each section contains a number of pixel columns. Each of these columns contains logic that asserts the column line in order to cause writing, i.e., drawing, into the memory 10. The rate of drawing varies depending on the scale of the horizontal axis. Although a variable clock rate may be used, currently the clock rate is fixed. With the fixed clock rate the fast rasterizer writing is controlled according to the rate at which the data is being received in real time. At the fastest rate every section writes one column per clock period. At slower rates the section_write_enable lines control which sections write, and only some sections are written per clock period. When the data rate matches the fixed clock rate, only one section is written per clock period. At slower data rates there are clock periods in which no data is written into the sections. For every column that is written, that section of the fast memory 10 is delivered row data. FIG. 7 represents typical column logic. Each section of the fast memory 10 has a section_write_enable line. Writing into that section only happens when this line is asserted, and these enable lines are organized into a section_write_enable bus. A second bus, the column_write_enable bus, goes to all sections of the fast memory 10. This bus contains one line connected to each column within a section. At most one line in this bus is asserted at any time. The column logic for each column within the fast memory 10 is connected to one line from the first bus and one line from the second bus. An AND gate 34 activates the column logic array only when both lines are asserted. The output of the AND gate 34 is connected to the D-input of a flip-flop 36. The flip-flop 36 is clocked at the start of every clock cycle of the fast memory 10. When the flip-flop 36 is set as a result of a "high" output from the AND gate 34, the column line of the fast memory 10 is asserted toward the end of the clock cycle by ANDing (38) the Q output of the flip-flop 36 with an inverted version of the clock. By delaying the assertion of the column line to the end of the clock cycle, the row logic 14 is given time to assert the row lines and for the row lines to become stable.

As indicated above, the read port of the fast memory 10 is totally independent from the bit-set port. The general scheme for reading the fast memory 10 is included in the description of the memory cell 12 above. The read port may be built in many different ways, depending on the order in which data is needed. Typical read logic may have the read lines organized into columns. Then one complete row of the fast memory 10 may be read out and clocked into flip-flops just before clearing the memory cells 12. The fast memory may be read at a slow rate, perhaps as slow as 70 times a second. The memory content is merged into the traditional raster memory that contains gray scale and color information as described above.

Thus the present invention provides a fast rasterizer by using a fast custom memory that is divided into sections and has a bit-set port totally independent of a readout and clear port.

What is claimed is:

1. A fast rasterizer comprising:

a fast memory for drawing a waveform image at rates up to a fastest rate at which data is acquired, the fast memory having a bit-set port for receiving the data and a waveform drawing command and having a totally independent readout and clear port for outputting the waveform image, the fast memory having a number of memory cells corresponding to rows and columns of a raster display device and being divided into sections that operate in parallel so that each section is capable of drawing one vertical column each memory cycle in order to draw a plurality of vertical columns corresponding to contiguous columns of the raster display device each memory cycle;

row and column logic coupled to the bit-set port for setting row lines in the fast memory as a function of the data; and means coupled to the totally independent readout and clear port for reading the waveform image and clearing the memory cells;

wherein said memory cell columns are sequentially addressed during a read operation to correspond to the contiguous columns of the raster display device and are physically located in different ones of said sections of said fast memory.

2. A method of fast rasterizing comprising the steps of:

dividing a rasterizer memory having a bit-set port and an independent readout/clear port and having a plurality of rows and columns corresponding to a raster display device into a plurality of sections, each section having a plurality of non-contiguous columns;

setting specified rows in one of the columns for each section on each clock cycle according to acquired data via the bit-set port to form a waveform image; and independently reading out and clearing the waveform image from the readout/clear port for combination with prior waveform images for display on the raster display device;

wherein a plurality of said columns are sequentially addressed during a read operation, one from each of said divided sections of said memory.

* * * * *